United States Patent [19]
Chondroudis et al.

[11] Patent Number: 6,117,498
[45] Date of Patent: Sep. 12, 2000

[54] SINGLE SOURCE THERMAL ABLATION METHOD FOR DEPOSITING ORGANIC-INORGANIC HYBRID FILMS

[75] Inventors: Konstantinos Chondroudis, North White Plains; David Brian Mitzi, Chappaqua; Michael Tony Prikas, North Valley Stream, all of N.Y.

[73] Assignee: International Business Machines Corporation, Armonk, N.Y.

[21] Appl. No.: 09/192,130

[22] Filed: Nov. 13, 1998

[51] Int. Cl.⁷ ...................................................... C23C 8/54
[52] U.S. Cl. .................... 427/590; 427/250; 427/255.14; 427/255.23; 427/255.6; 427/294; 427/383.1; 427/384; 427/587; 427/590
[58] Field of Search ..................................... 427/587, 593, 427/250, 255.14, 255.23, 255.6, 294, 384, 383.1, 590

[56] References Cited

U.S. PATENT DOCUMENTS 5,871,579  2/1999  Liang et al. .

*Primary Examiner*—Bernard Pianalto
*Attorney, Agent, or Firm*—McGinn & Gibb, P.C.

[57] ABSTRACT

In order to form a film of organic-inorganic hybrid material, such as a perovskite material, in a selected stoichiometric ratio upon a surface of a substrate, the proposed method entails a number of simple steps. First, a substrate and a selected quantity of an organic-inorganic hybrid material are placed in a chamber, with the hybrid material being placed on a heater. Then, the hybrid material is heated sufficiently, as by passing an electric current through the heater, to cause its total ablation. As a consequence, a film of the organic-inorganic hybrid material, in the aforesaid selected stoichiometric ratio, reassembles as a film upon a surface of the substrate. During the heating step, the chamber may be either evacuated to a pressure below $10^{-3}$ torr or filled with an inert gas, such as nitrogen.

20 Claims, 6 Drawing Sheets

SINGLE SOURCE THERMAL ABLATION METHOD FOR DEPOSITING ORGANIC-INORGANIC HYBRID FILMS

STATEMENT OF GOVERNMENT RIGHTS

The Government of the United States has rights in this invention pursuant to Contract No. DAAL01-96-C-0095 awarded by the Defence Advanced Research Projects Agency.

FIELD OF THE INVENTION

The present invention relates to the deposition of films of organic-inorganic hybrid material, in selected stoichiometric ratios, upon surfaces of substrates.

For the purposes of the present invention, an organic-inorganic hybrid material is a material composed of organic and inorganic components, which are mixed together on a molecular level, wherein the material is characterized by a substantially fixed ratio of each organic component to each inorganic component.

BACKGROUND OF THE INVENTION

Organic-inorganic hybrids have recently attracted substantial attention due to the potential of combining distinct properties of organic and inorganic components within a single molecular composite. The natural quantum well structures formed by the organic-inorganic perovskites, for example, exhibit a number of interesting and potentially useful properties. Several members of this family exhibit a semiconductor-metal transition as a function of increasing perovskite sheet thickness (or well width) (see D. B. Mitzi, C. A. Feild, W. T. A. Harrison, and A. M. Guloy, Nature 369, 467 (1994); and D. B. Mitzi, S. Wang, C. A. Feild, C. A. Chess, and A. M. Guloy, Science 267, 1473 (1995)). Strong, wavelength tunable photoluminescence (see T. Ishihara, J. Takahashi, and T. Goto, Solid State Commun. 69, 933 (1989), and G. C. Papavassiliou and I. B. Koutselas, Synthetic Metals 71, 1713 (1995)) and optical third harmonic generation (see J. Calabrese, N. L. Jones, R. L. Harlow, N. Herron, D. L. Thorn, and Y. Wang, J. Am. Chem. Soc. 113, 2328 (1991)) have also been noted at room temperature, as a result of the radiative decay of excitons (with exceptionally large binding energies and oscillator strength) in the inorganic sheets. Recently, a heterostructure electroluminescent (EL) device has been demonstrated (see M. Era, S. Morimoto, T. Tsutsui, and S. Saito, Appl. Phys. Lett. 65, 676 (1994)) which employs $(C_6H_5C_2H_4NH_3)_2PbI_4$ as the active light-emitting component, with intense electroluminescence of more than 10,000 cd/m$^2$ observed at liquid nitrogen temperature. Besides the perovskite family, other organic-inorganic hybrids exhibit a range of interesting properties including superconductivity, non-linear optical and catalytic properties.

Of particular importance for many experimental studies and potential applications is the need for simple and inexpensive thin film deposition techniques. One of the key difficulties in depositing thin films of organic-inorganic hybrids is the distinctly different character of the organic and inorganic components with regard to potential film forming processes. Organic materials tend to be soluble in solvents which are not, in general, the same as those appropriate for the inorganic component, making it often impractical to find a suitable solvent to enable solution deposition techniques (e.g. spin-coating). Additionally, organic compounds tend to decompose at relatively low temperature, whereas inorganic materials often do not effectively evaporate until much higher temperatures.

Recently, a new dip-processing technique has been demonstrated (see K. Liang, D. B. Mitzi, and M. T. Prikas, Chem. Mater. 10, 403 (1998)) for the deposition of organic-inorganic perovskites, in which a metal halide film (deposited by thermal evaporation) reacts with organic cations contained in a dipping solution. While this technique is potentially useful for certain compounds and applications, the resulting film surfaces are often locally rough and a suitable solvent is still required for the dipping process. An entirely vacuum compatible two-source thermal evaporation technique has also been demonstrated (see Era M., T. Hattori, T. Taira, and T. Tsutsui, Chem. Mater. 9, 8 (1997)) in which the organic and metal halide salts are individually thermally evaporated. However, control of the organic salt evaporation rate, and therefore the balancing of the two deposition rates, is difficult since the organic ammonium halide salt generally does not evaporate as a molecular species, but rather dissociates into the free organic amine and hydrogen halide gas.

SUMMARY OF THE INVENTION

Gradual heating of organic-inorganic hybrid materials generally results in the decomposition or dissociation of the organic component at a lower temperature than that required for the inorganic component to evaporate, making single source deposition apparently unfeasible. Upon heating the perovskites, for example, the organic ammonium cation generally decomposes from the sample at a temperature well below that necessary to evaporate the metal halide component left behind. The present invention teaches that when organic-inorganic hybrid materials are heated rapidly enough, using the proposed single source thermal ablation (SSTA) technique, both components evolve from the starting organic-inorganic hybrid at effectively the same time, surprisingly without the organic component decomposing, enabling the deposition of high quality organic-inorganic films.

The present invention broadly provides a method of forming a film of organic-inorganic hybrid material upon a surface of a substrate, the method comprising the steps of:
a) placing the substrate into a chamber,
b) placing a selected quantity of the organic-inorganic hybrid material, in a selected stoichiometric ratio thereof, into said chamber, and
c) heating the aforesaid selected quantity of organic-inorganic hybrid material sufficiently to cause total ablation thereof and consequent deposition of a film of the aforesaid organic-inorganic hybrid material upon the substrate surface in substantially the aforesaid selected stoichiometric ratio thereof.

According to one preferred embodiment, the organic-inorganic hybrid material comprises a perovskite material of the form $(R-NH_3)_2MX_4$, where R comprises an organic component, M is a divalent metal, and X is a halogen. For example, the perovskite material may be $(C_6H_5C_2H_4NH_3)_2PbI_4$, $(C_6H_5C_2H_4NH_3)_2PbBr_4$, or $(C_4H_9NH_3)_2SnI_4$.

Alternatively, the organic-inorganic hybrid material may comprise a non-perovskite material. For example, the compound $NH_3(CH_2)_6NH_3BiI_5$ is a non-perovskite material having a quasi-one-dimensional framework of $BiI_5^{2-}$ chains separated by organic cations.

In one preferred embodiment, the method is carried out while the chamber is at a pressure of less than $10^{-3}$ torr. during heating step (c).

Alternatively, the novel method may be carried out while maintaining a chemically inert gas atmosphere within said chamber during heating step (c), preferably with the chemically inert gas (e.g. nitrogen gas, $N_2$) flowing in a direction from said selected quantity of organic-inorganic hybrid material toward the substrate (to help transport ablated organic-inorganic hybrid material to the substrate).

Preferably, the heating is carried out by placing the selected quantity of organic-inorganic hybrid material on an electric heater and passing an electric current therethrough to heat the selected quantity to cause total ablation thereof. For example, the heater may include a sheet of tantalum through which an electric current may be passed. Moreover, in one approach, the selected quantity of material may be placed on the electric heater in the form of a solution comprising the organic-inorganic hybrid material (e.g. perovskite) together with a solvent therefor, and then drying that solution within the chamber before passing the electric current through the heater.

DETAILED DESCRIPTION

Figure 1:
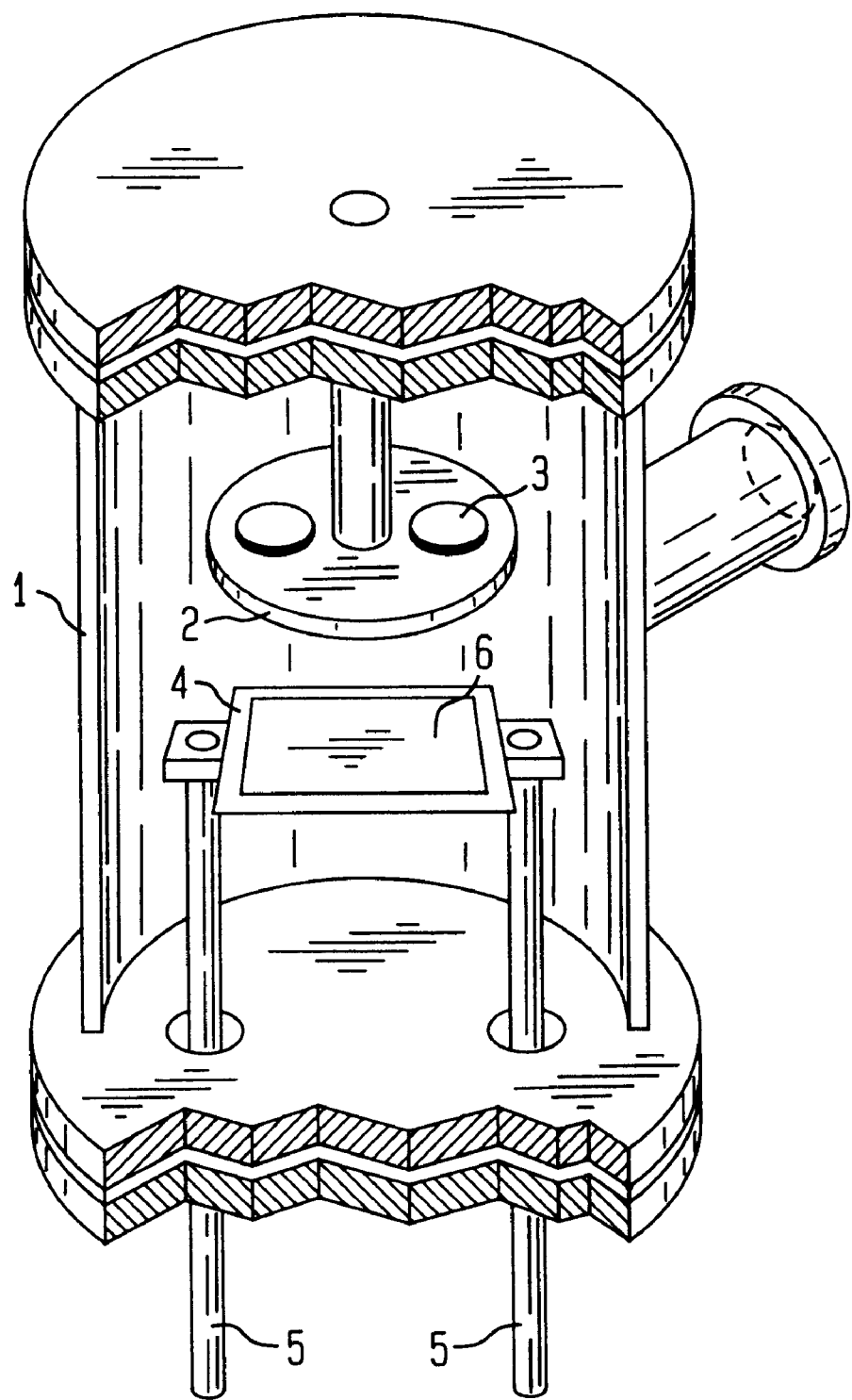
FIG. 1 is a schematic diagram of a single source thermal ablation chamber which may be used in carrying out an embodiment of the method of the present invention using a vacuum.

The single source thermal ablation (SSTA) apparatus of FIG. 1 consists of a vacuum chamber 1 with a substrate holder 2 for holding substrates 3 (e.g. quartz, sapphire, glass, plastic, etc. ) and a thin tantalum sheet 4 positioned directly below the substrates 3. The tantalum sheet 4 is connected to a power supply through an electrical feedthrough 5. The tantalum heater 4 can, of course be replaced with a sheet of another conducting material. However, for the example of metal halides considered here, tantalum is a good choice since it does not react with the compounds when heated. The selected quantity 6 of organic-inorganic hybrid material (the "single source") can be deposited on the heater 4 as crystals or powder, or in the form of a concentrated solution (which is then allowed to dry). In either case (solid or liquid), the goal is to uniformly cover the heater with a selected quantity 6 of the organic-inorganic hybrid material. After a suitable vacuum has been established ($<10^{-4}$ torr), a large current is passed through the tantalum sheet 4. The sheet 4 typically heats to approximately 1000° C. in 1–2 sec. Generally, the organic-inorganic material 6 ablates from the surface of heater 4 well before it incandesces and leaves a deposit in the form of a film of the organic-inorganic hybrid material 6 upon substrates 3. Note that an ultrahigh vacuum is not required for SSTA deposition since the ablation process is so quick (a few seconds at most). Consequently, the chamber can be quickly pumped down and the evaporation completed within a short period of time.

A number of organic-inorganic perovskites have been deposited using this technique, including $(C_6H_5C_2H_4NH_3)_2PbI_4$, $(C_6H_5C_2H_4NH_3)_2PbBr_4$, and $(C_4H_9NH_3)_2SnI_4$. These three examples demonstrate that among the strongly luminescent organic-inorganic perovskites, the technique can be used for a range of organic cations and metal halide inorganic frameworks.

For each compound, approximately 15 mg of the organic-inorganic perovskite is dissolved in 1 ml of anhydrous N,N-dimethylformamide (DMF). A small volume (0.1–0.4 ml) of the solution is dried on the 0.025 mm thick tantalum foil. The quantity of solution deposited on the heater determines the thickness of the final films on the quartz substrates after ablation. After pumping the chamber to $<10^{-4}$ torr, the vacuum valve is closed, thereby isolating the chamber from the pump, and a current of 80–90 Amp is applied for 1–5 sec (the material on the heater is ablated well before the heater is shut off). Film thicknesses upon the substrates 3 range from 10 to >200 nm, depending on the selected quantity 6 of material used on the heater 4. For perovskites such as $(C_6H_5C_2H_4NH_3)_2PbBr_4$, and $(C_4H_9NH_3)_2SnI_4$, the best results are achieved by using a stoichiometric starting solution. However, for the perovskite $(C_6H_5C_2H_4NH_3)_2PbI_4$, better results can be achieved by including a small excess of phenethylammonium iodide in the initial solution (for example, 15 mg $(C_6H_5C_2H_4NH_3)_2PbI_4$ and 2 mg $C_6H_5C_2H_4NH_2HI$).

Figure 2:
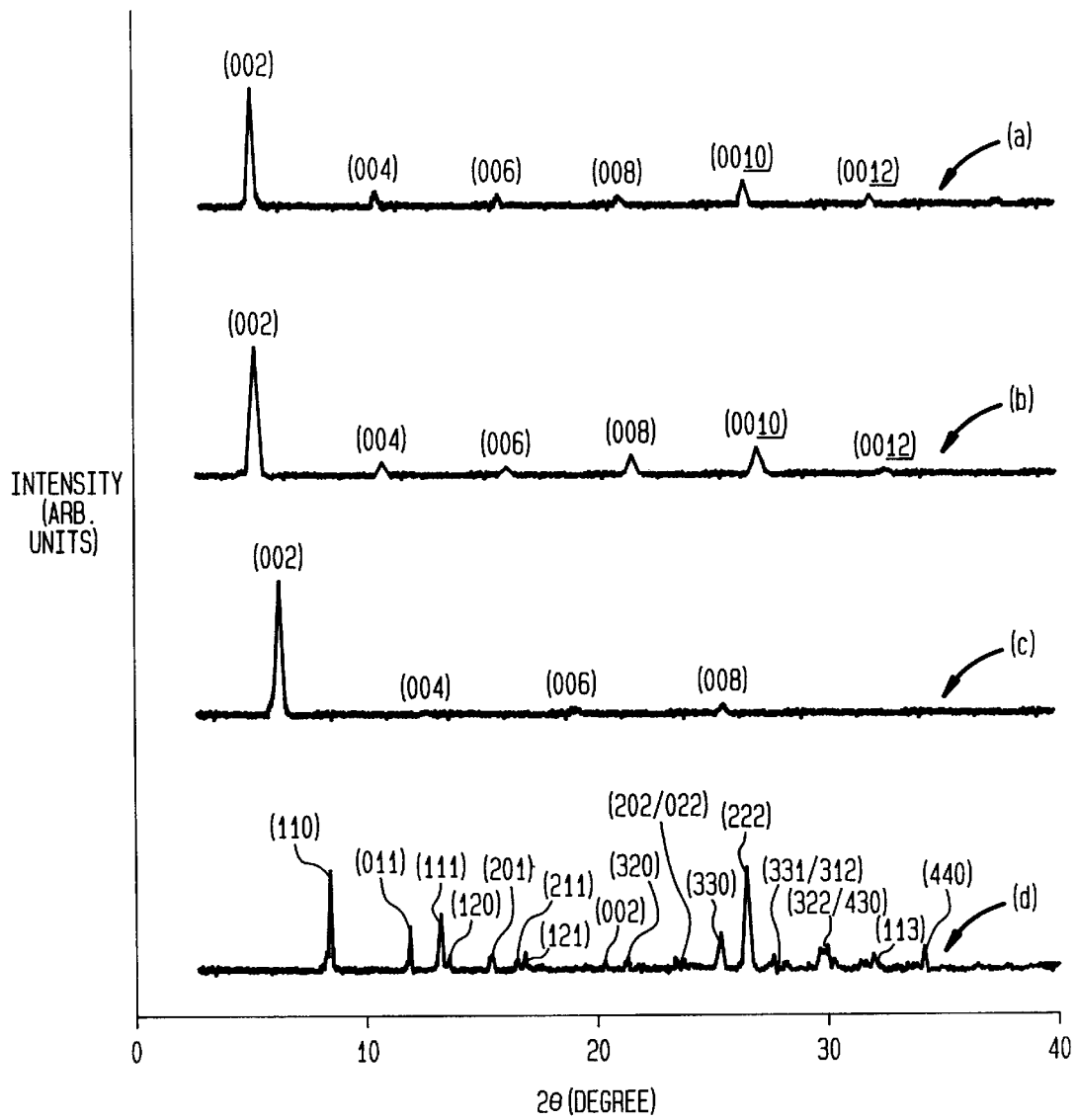
FIG. 2 shows a graph of X-ray diffraction patterns at room temperatures for various organic-inorganic hybrid materials deposited on quartz using the SSTA method of the present invention.

FIG. 2 shows the X-ray diffraction patterns (a), (b), and (c) for each of the above three perovskites $(C_6H_5C_2H_4NH_3)_2PbI_4$, $(C_6H_5C_2H_4NH_3)_2PbBr_4$, and $(C_4H_9NH_3)_2SnI_4$, respectively, deposited using the novel SSTA thermal ablation process in a vacuum environment. In each case, the single-phase films are highly oriented [i.e. only (001) reflections are observed]. The c axis lattice parameters for each film agree with the values observed in single crystal diffraction studies (D. B. Mitzi, Progress in Inorganic Chemistry, 48, 1, (in press)). The existence of a number of higher order (001) reflections indicates that the films are well crystallized. Note that for films deposited using the two-source thermal evaporation technique, (see Era M., T. Hattori, T. Taira, and T. Tsutsui, Chem. Mater. 9, 8 (1997)) only the first order reflection [i.e. (002)] was observed in the X-ray diffraction pattern.

To highlight the versatility of the SSTA technique, thin films of the non-perovskite $NH_3(CH_2)_6NH_3BiI_5$ have also been deposited. The $NH_3(CH_2)_6NH_3BiI_5$ structure consists of a framework of quasi-one-dimensional $BiI_5^{2-}$ chains separated by the organic cations. Pattern (d) of FIG. 2 shows an X-ray diffraction pattern for a representative film of this compound. As indicated by the wide range of reflection indices, the films of $NH_3(CH_2)_6NH_3BiI_5$ are less crystallographically oriented than the two-dimensional superlattice films formed by the layered perovskites. A number of other organic-inorganic compounds have been deposited using SSTA, including several examples of metastable phases, which revert to thermodynamically stable structures upon annealing below 110° C. in an inert atmosphere. In addition, the SSTA process addresses the problem of depositing mixed organic component hybrid systems since, regardless of the volatility of each component, everything on the heater sheet ablates virtually simultaneously.

Figure 3:
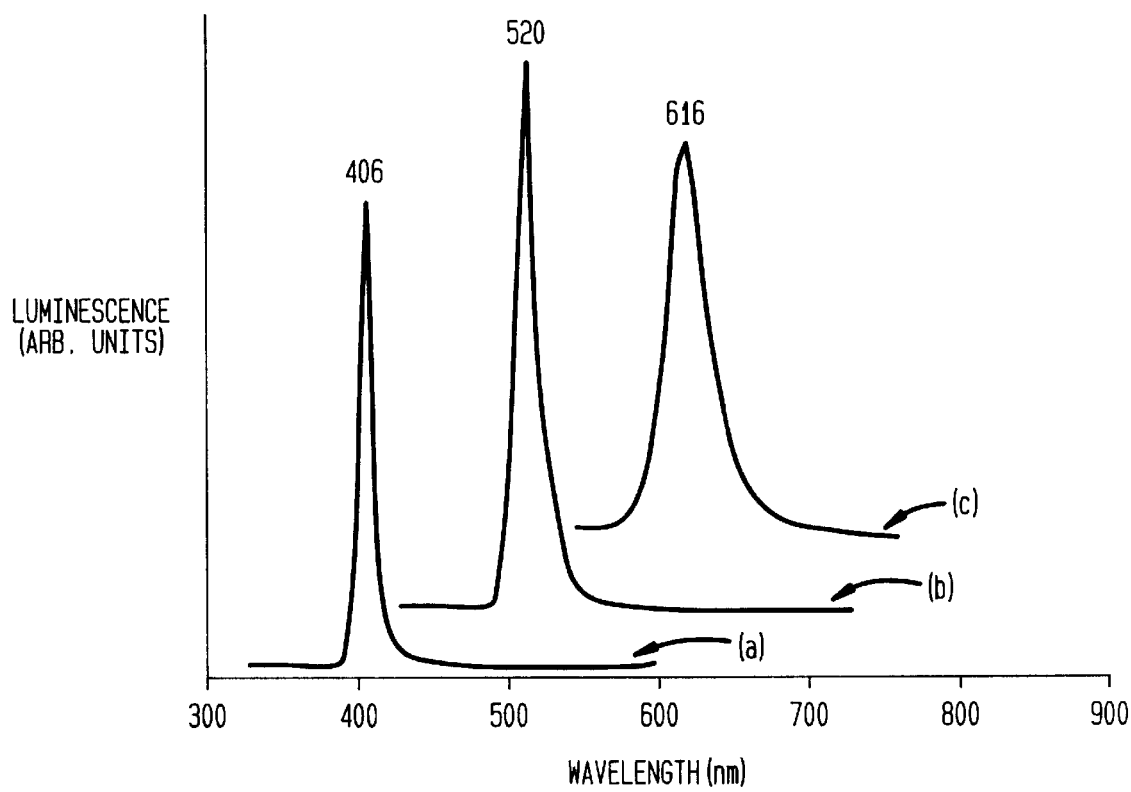
FIG. 3 shows a graph of photoluminescence spectra at room temperature for various organic-inorganic perovskites deposited on a quartz substrate using the SSTA method of the present invention.

The luminescence spectra for each of the three perovskite materials $(C_6H_5C_2H_4NH_3)_2PbI_4$, $(C_6H_5C_2H_4NH_3)_2PbBr_4$, and $(C_4H_9NH_3)_2SnI_4$ deposited using the SSTA technique are also compared in FIG. 3 in the spectra (a), (b), and (c), respectively. The sharp peak in each spectrum corresponds to the radiative decay of excitons within the inorganic sheets of the organic-inorganic perovskite structure and further demonstrates the high quality of the films.

Figure 4:
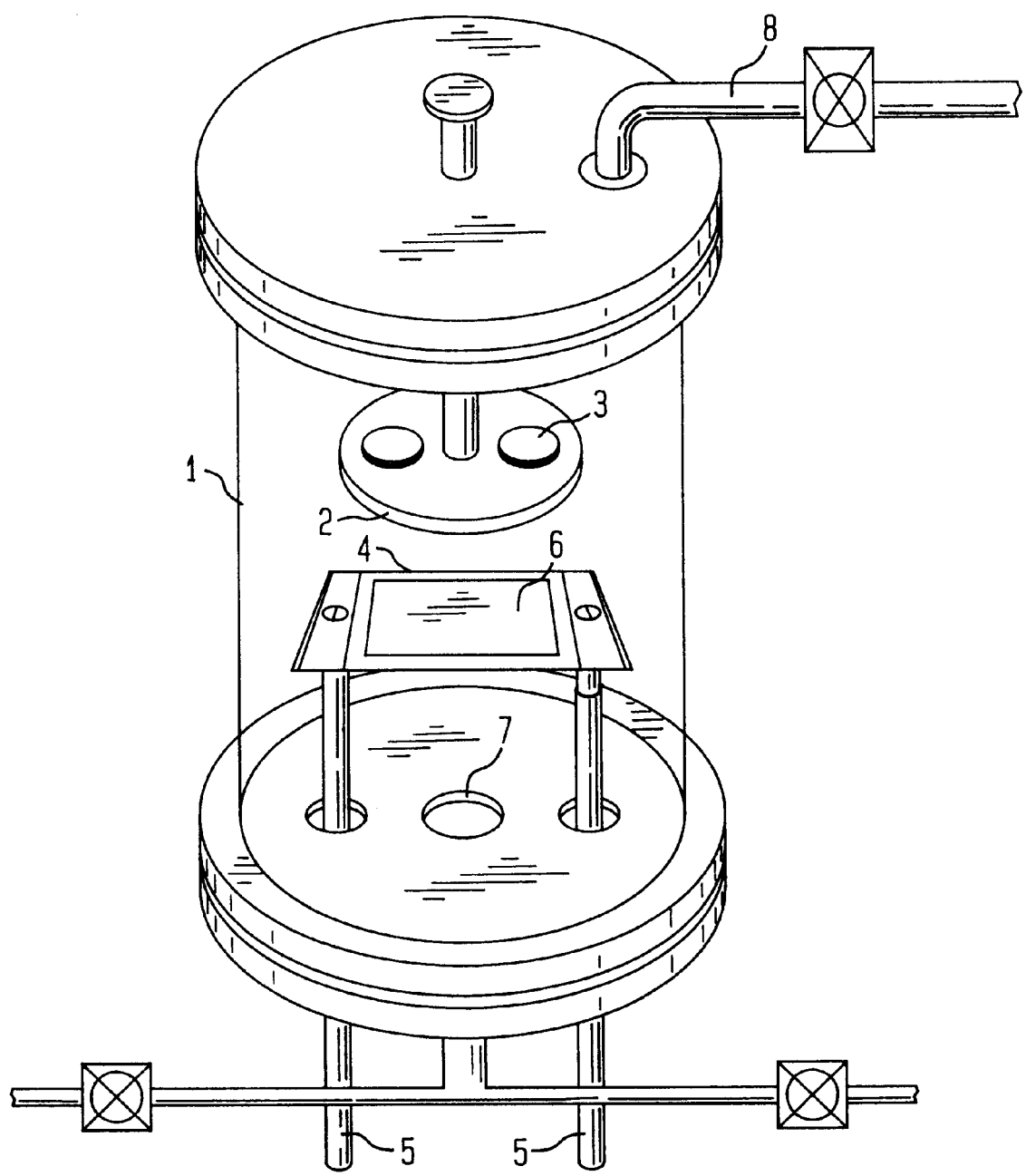
FIG. 4 is a schematic diagram of a single source thermal ablation chamber which may be used in carrying out an embodiment of the method of the present invention using an inert gas atmosphere.

The single source thermal ablation (SSTA) technique has also been found to be more general than described above. In some cases, it may be desirable to perform the ablation in an inert atmosphere rather than in a vacuum environment. For example, this might facilitate a quick sample throughput in a development or fabrication environment. We have demonstrated that the vacuum process described above can be performed in a nitrogen (or other inert) atmosphere. The chamber 1 for performing the test is shown in FIG. 4 and contains similar components to those of the vacuum chamber system of FIG. 1. In addition, the parameters used for the ablation are similar to those used for SSTA in a vacuum environment. The main difference in components is the presence of a nitrogen gas inlet 7 and outlet 8. During the film deposition, a flow of nitrogen is introduced into the chamber. The nitrogen flow maintains an inert atmosphere and also carries the evaporated organic-inorganic hybrid material from the source 6 to the substrates 3. Note that, in some cases, it might be more convenient if the deposition chamber were in a horizontal configuration (rather than vertical), perhaps even with one end open so that samples could be taken in, the films deposited, and the samples removed, in a very short period of time.

Figure 5:
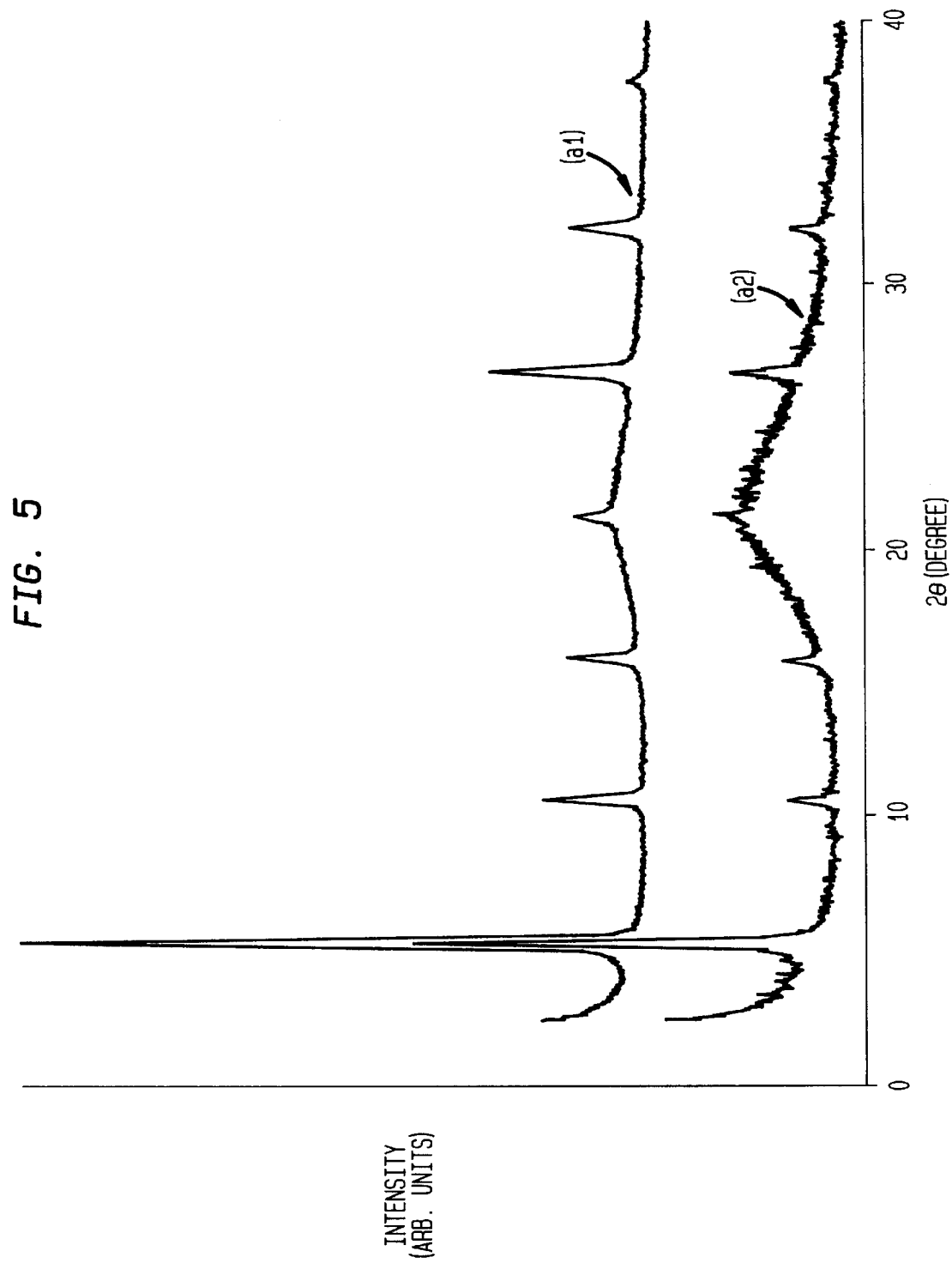
FIG. 5 shows a graph of X-ray diffraction patterns at room temperature for one organic-inorganic perovskite material deposited on quartz using the SSTA method of the present invention in both a vacuum and in an inert nitrogen gas atmosphere.

FIG. 5 shows the X-ray diffraction pattern (a2) of a $(C_6H_5C_2H_4NH_3)_2PbBr_4$ film deposited using the SSTA process in a nitrogen flow. Note that the diffraction pattern (a2) is similar to the pattern (a1) for a film deposited in vacuum.

Figure 6:
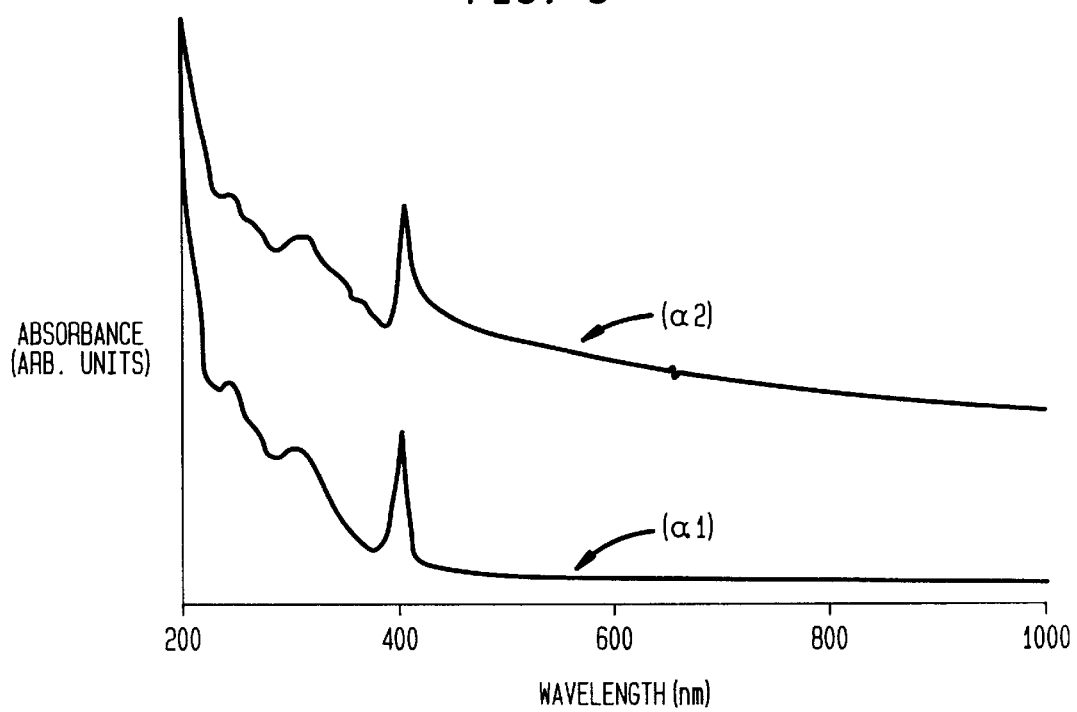
FIG. 6 shows a graph of absorption spectra at room temperature for the organic-inorganic perovskite of FIG. 5, deposited on a quartz substrate using the SSTA method of the present invention, in both a vacuum and an inert nitrogen gas atmosphere.

Similarly, FIG. 6 demonstrates that the optical properties of the film are similar for the vacuum—and nitrogen atmosphere-deposited samples as shown in spectra (a1) and (a2), respectively.

In summary, we have demonstrated that a substantial range of organic-inorganic hybrids can be ablated at temperatures high enough for the inorganic component to quickly evaporate, without the organic component thermally decomposing. The reorganization (or self-assembly) of the organic and inorganic components into the organic-inorganic hybrid after ablation generally occurs on the substrate during the deposition process, without the need for post-processing (e.g. annealing) of the films. In contrast to spin-coating or dip-processing, which can be employed only if suitable solvents can be identified, or the two source thermal evaporation technique, which can only be used when the organic component evaporates in an easily controllable manner, the SSTA technique is versatile and should work for any system in which the organic component does not decompose under the rapid heating conditions employed.

The SSTA process is similar in concept to laser ablation, which has been used to deposit a number of multicomponent inorganic films. In contrast to laser ablation, however, which might lead to photodegradation of the organic molecules, heating is generated by passing a current through a resistive sheet. The high quality of the resulting films and the ability to pattern the films during the deposition process suggests the applicability of the SSTA process for fabricating devices. Preliminary LED devices incorporating patterned SSTA-deposited $(C_6H_5C_2H_4NH_3)_2PbX_4$ (X=Br and I) exhibit strong electroluminescence at liquid nitrogen temperature.

While the present invention has been described with reference to preferred embodiments thereof in order to facilitate a better understanding of the invention, those skilled in the art will recognize that the invention can be embodied in various ways without departing from the scope and spirit of the invention as set forth in the appended claims.

What is claimed is:

1. A method of forming a film of organic-inorganic hybrid material upon a surface of a substrate, said method comprising:

placing said substrate into a chamber;

placing a selected quantity of said organic-inorganic hybrid material, in a selected stoichiometric ratio thereof, into said chamber; and heating said selected quantity of organic-inorganic hybrid material sufficiently to cause total ablation thereof and consequent deposition of a film of said organic-inorganic hybrid material upon said surface in substantially said selected stoichiometric ratio thereof.

2. A method as set forth in claim 1, said organic-inorganic hybrid material comprising a perovskite material of the form $(R{-}NH_3)_2MX_4$, where R comprises an organic component, M is a divalent metal, and X is a halogen.

3. A method as set forth in claim 2, wherein said perovskite material comprises a member selected from the group consisting of $(C_6H_5C_2H_4NH_3)_2PbI_4$, $(C_6H_5C_2H_4NH_3)_2PbBr_4$, and $(C_4H_9NH_3)_2SnI_4$.

4. The method according to claim 1, wherein the organic component and the inorganic component of the hybrid material recombine on the substrate and form a crystalline deposit of the desired organic-inorganic hybrid, without a post-deposition treatment of the substrate.

5. A method as set forth in claim 1, said method further comprising:

maintaining said chamber at a pressure of less than $10^{-3}$ torr. during said heating.

6. A method as set forth in claim 5, wherein said heating is carried out by placing said selected quantity on an electric heater and passing an electric current therethrough to heat said selected quantity to cause total ablation thereof.

7. A method as set forth in claim 6, wherein said heating is carried out by placing said selected quantity on a sheet of tantalum and passing an electric current therethrough.

8. A method as set forth in claim 6, wherein said selected quantity is placed on said electric heater in a form of solution comprising said organic-inorganic hybrid material and a solvent therefor, said method further comprising:

drying said solution within said chamber before passing said current through said heater.

9. The method according to claim 1, wherein said method is devoid of a solution processing.

10. A method as set forth in claim 1, said method further comprising:

maintaining an atmosphere of a chemically inert gas within said chamber during said heating.

11. A method as set forth in claim 10 wherein said chemically inert gas flows in a direction from said selected quantity of organic-inorganic hybrid material toward said substrate.

12. A method as set forth in claim 10 or 11, wherein said chemically inert atmosphere comprises nitrogen gas.

13. A method as set forth in claim 10, wherein said heating is carried out by placing said selected quantity on an electric heater and passing an electric current therethrough to heat said selected quantity to cause total ablation thereof.

14. A method as set forth in claim 13, wherein said heating is carried out by placing said selected quantity on a sheet of tantalum and passing an electric current therethrough.

15. A method as set forth in claim 13, wherein said selected quantity is placed on said electric heater in the form of a solution comprising said organic-inorganic hybrid material and a solvent therefor, said method comprising:

drying said solution within said chamber before passing said current through said heater.

16. The method according to claim 1, wherein said heating comprises heating the organic-inorganic hybrid at a predetermined high speed such that the organic component is not decomposed or dissociated from the substrate prior to said inorganic component.

17. The method according to claim 16, wherein the organic component and said inorganic component of said hybrid evolve from the heated surface at substantially a same time and before the organic component begins to decompose.

18. The method according to claim 1, wherein said method is vacuum-compatible without a solution processing of said substrate.

19. A method as set forth in claim 1, said organic-inorganic hybrid material comprising a non-perovskite material having a quasi-one-dimensional framework of $BiI_5^{2-}$ chains separated by organic cations.

20. A method as set forth in claim 19, wherein said non-perovskite material is $NH_3(CH_2)_6NH_3BiI_5$.

* * * * *